United States Patent
Lee et al.

(10) Patent No.: US 6,573,563 B2
(45) Date of Patent: Jun. 3, 2003

(54) SOI SEMICONDUCTOR INTEGRATED CIRCUIT FOR ELIMINATING FLOATING BODY EFFECTS IN SOI MOSFETS

(75) Inventors: Soo-Cheol Lee, Seoul (KR); Tae-Jung Lee, Kyunggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/872,429

(22) Filed: Jun. 1, 2001

(65) Prior Publication Data

US 2002/0105032 A1 Aug. 8, 2002

(30) Foreign Application Priority Data

Feb. 7, 2001 (KR) .............................................. 01-5976

(51) Int. Cl.⁷ ............................................. H01L 27/01
(52) U.S. Cl. ................... 257/349; 257/347; 257/349; 257/373; 257/374; 257/382; 257/396; 438/155; 365/189.09
(58) Field of Search ................. 257/347, 349, 257/373, 374, 382, 396, 510, 515, 517; 365/189.09; 438/155

(56) References Cited

U.S. PATENT DOCUMENTS 5,994,756 A * 11/1999 Umezawa et al. .......... 257/374
6,111,293 A * 8/2000 Liao ........................... 257/347
6,341,087 B1 * 1/2002 Kunikiyo ............... 365/189.09
6,352,882 B1 * 3/2002 Assaderaghi et al. ....... 438/155

* cited by examiner

Primary Examiner—David Nelms
Assistant Examiner—Mai-Huong Tran
(74) Attorney, Agent, or Firm—Mills & Onello LLP

(57) ABSTRACT

A silicon-on-insulator (SOI) integrated, circuit is provided. A plurality of transistor active regions and at least one body contact active region are formed on an SOI substrate. A semiconductor residue layer, which is thinner than the transistor active regions and the body contact active region, is disposed between the transistor active regions and the body contact active region. The transistor active regions, the body contact active region and the semiconductor residue layer are disposed on a buried insulating layer of the SOI substrate. The semiconductor residue layer is covered with a partial trench isolation layer. A bar-shaped full trench isolation layer is interposed between the adjacent transistor active regions. The full trench isolation layer is in contact with sidewalls of the transistor active regions adjacent thereto and is in contact with the buried insulating layer between the adjacent transistor active regions. An insulated gate pattern crosses over the respective transistor active regions. The insulated gate pattern is disposed to be parallel with the full trench isolation layer.

5 Claims, 17 Drawing Sheets

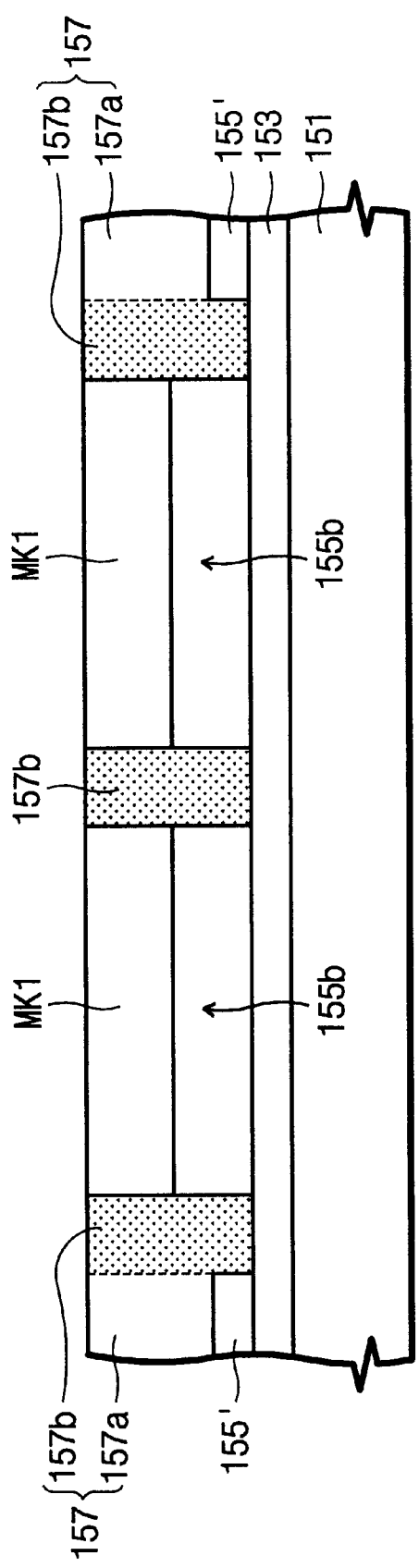

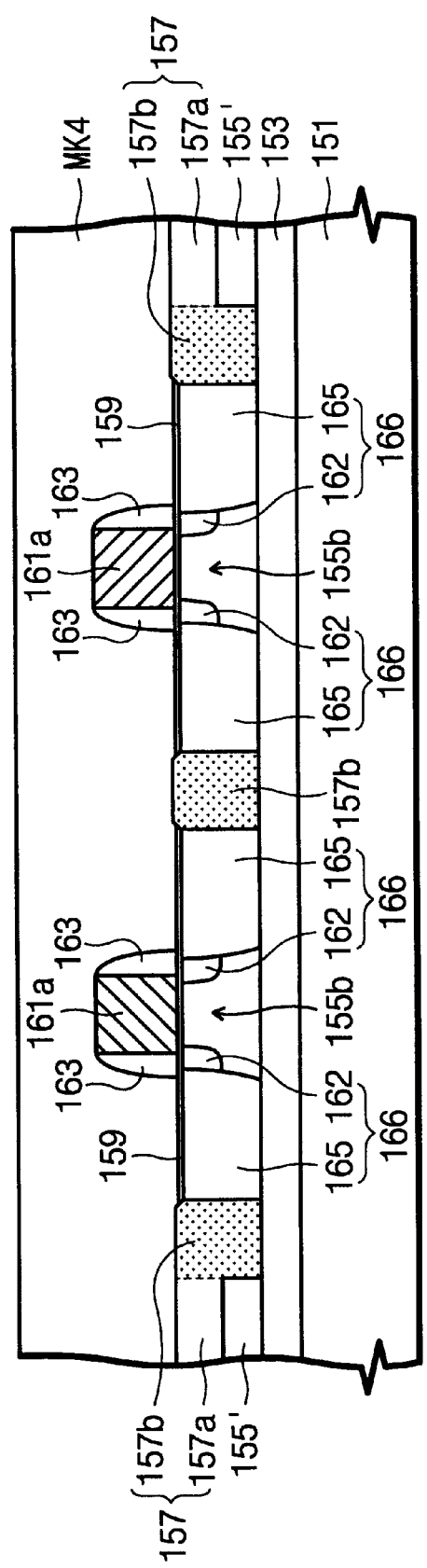

SOI SEMICONDUCTOR INTEGRATED CIRCUIT FOR ELIMINATING FLOATING BODY EFFECTS IN SOI MOSFETS

This application relies for priority upon Korean Patent Application No. 2001-05976, filed on Feb. 7, 2001, the contents of which are herein incorporated by reference in their entirety.

FIELD OF THE INVENTION

The present invention generally relates to silicon-on-insulator (SOI) technology, and more particularly to an SOI semiconductor integrated circuit for eliminating floating body effects in SOI MOSFETs and a method of fabricating the same.

DESCRIPTION OF THE RELATED ART

In the semiconductor manufacturing industry, there has been a great deal of attention paid to reducing parasitic capacitance and resistance to increase the operating speed of semiconductor integrated circuits. SOI MOSFETs have been demonstrated to be superior to bulk silicon MOSFETs in terms of low power, high speed very large scale integration (VLSI) applications because of their inherent merits such as less junction capacitance and better device isolation. In addition, there are many advantages in SOI devices such as better immunity to soft errors, reduction in dynamic power, improvement in latch-up resistance even with increased packing density. Despite the above outstanding features of SOI devices. SOI integrated circuits have suffered some lack of commercial success due to technical problems in material processing and device design.

FIG. 1 is a top plan view schematically showing a conventional SOI transistor. Also, FIG. 2 is a cross-sectional view taken along the line I–I' of FIG. 1, and FIG. 3 is a cross-sectional view taken along the line II–II' of FIG. 1. Referring to FIGS. 1 to 3, an SOI structure includes a supporting substrate 1, a buried insulating layer 3 on the supporting substrate 1 and a semiconductor layer 5 of a first conductivity type on the buried insulating layer 3. The semiconductor layer 5 is etched to form a partial trench region having a depth which is less than the thickness of the semiconductor layer 5. Thus, a semiconductor residue layer exists under the partial trench region. The partial trench region defines a transistor active region 5b and a body contact active region 5a spaced apart from the transistor active region 5b. The partial trench region is then filled with an isolation layer 7. An insulated gate pattern 11 crosses over the transistor active region 5b. The insulated gate pattern 11 is electrically isolated from the transistor active region 5b by a gate dielectric layer 9. Source/drain regions 16 of a second conductivity type are formed at the transistor active region 5b, which is located at both sides of the insulated gate pattern 11. Each of the source/drain regions 16 may have a lightly doped drain (LDD) structure. This LDD structure comprises a lightly doped region 12 and a heavily doped region 15, and may be realized using a spacer 13 formed on the sidewall of the insulated gate pattern 11. Here, the source/drain regions 16 are formed so that they are in contact with the buried insulating layer 3 in order to reduce parasitic capacitance. Impurities of the first conductivity type are implanted into the body contact active region 5a, thereby forming a well contact region 17 at the body contact active region 5a.

As described above, the conventional SOI technique provides an SOI transistor having an improved characteristic in terms of parasitic junction capacitance. However, sidewall capacitance still exists, since the lower sidewalls of the source/drain regions are in direct contact with the semiconductor residue layer under the isolation layer as shown in FIG. 3. In addition, the semiconductor residue layer completely surrounds the transistor active region 5b. Thus, latch-up immunity is reduced. Accordingly, there continues to be a need for improved SOI techniques.

SUMMARY OF THE INVENTION

In view of these problems, there is need for a method and structure for fundamentally eliminating the floating body effect in SOI semiconductor integrated circuits, which is not subject to these limitations.

Accordingly, it is an object of the present invention to provide a technique to eliminate the floating body effect in SOI integrated circuits.

It is another object of the present invention to provide a technique to reduce the parasitic junction capacitance and improve the latch-up immunity in SOI integrated circuits.

Accordingly, the invention is directed to a SOI semiconductor integrated circuit and a method of making the same. The SOI integrated circuit of the invention is formed on an SOI substrate including a supporting substrate, a buried insulating layer on the supporting substrate and a semiconductor layer of a first conductivity type on the buried insulating layer. The SOI integrated circuit of the invention includes a plurality of transistor active regions and at least one body contact active region spaced apart from the transistor active regions. The transistor active regions and the body contact active region are composed of a portion of the semiconductor layer. The buried insulating layer, which is located between the transistor active regions and the body contact active region, is covered with a semiconductor residue layer. The semiconductor residue layer is thinner than the transistor active regions and the body contact active region. As a result, a partial trench region exists between the transistor active regions and the body contact active region. The partial trench region is filled with a partial trench isolation layer. An insulated gate pattern crosses over each of the transistor active regions. A full trench isolation layer is interposed between the adjacent transistor active regions. The full trench isolation layer has a bar shape which is parallel with the gate pattern. Also, the full trench isolation layer is in contact with the buried insulating layer between the adjacent transistor active regions.

In one embodiment, the first conductivity type is either P or N type. The semiconductor layer can be a silicon layer.

In one embodiment, the present invention further comprises source/drain regions formed at the transistor active regions, which are located at both side of the insulated gate pattern. The source/drain regions can be of a second conductivity type opposite to the first conductivity type, and the source/drain regions can be in contact with the buried insulating layer. Also, the full trench isolation layer can be in contact with the sidewalls of the source/drain regions, which are parallel with the gate pattern. Thus, the full trench isolation layer isolates SOI MOSFETs formed at the adjacent transistor active regions. As a result, it is possible to minimize the parasitic junction capacitance of the source/drain regions as well as enhance the latch-up immunity.

The invention is also directed to a method of making a SOI semiconductor integrated circuit on an SOI substrate including a supporting substrate, a buried insulating layer on the supporting substrate and a semiconductor layer of a first conductivity type on the buried insulating layer. In accordance with the method, a predetermined region of the semiconductor layer is etched to form a partial trench region defining a plurality of transistor active regions and at least one body contact active region spaced apart from the transistor active regions. At this time, a semiconductor residue layer, which is thinner than the semiconductor layer, exists under the partial trench region. The semiconductor residue layer is selectively etched until the buried insulating layer is exposed, thereby forming a bar shaped full trench region between the adjacent transistor active regions. As a result of the selective etching, sidewalls of the transistor active regions, which are adjacent to the full trench isolation layer, are exposed. A full trench isolation layer and a partial trench isolation layer are formed in the full trench region and in the partial trench region, respectively. An insulated gate pattern is formed to be across each of the transistor active regions. The gate pattern is formed to be parallel with the full trench isolation layers.

In one embodiment, forming the partial trench region includes forming a first trench mask pattern on the semiconductor layer. Using the first trench mask pattern as an etching mask, the semiconductor layer is etched to a predetermined thickness which is thinner than the semiconductor layer. Forming the first trench mask pattern can include forming a first trench mask layer on the semiconductor layer and patterning the first trench mask layer. The first trench mask layer can be formed by sequentially stacking a pad oxide layer and a pad nitride layer on the semiconductor layer.

Forming the full trench region can include forming a second trench mask pattern having a bar-shaped opening that exposes a portion of the semiconductor residue layer between the adjacent transistor active regions. Using the first and second trench mask patterns as etching masks, the exposed semiconductor residue layer is etched until the buried insulating layer is exposed, and the second trench mask patter is removed. Forming the full trench isolation layer and the partial trench isolation layer can include forming an insulating layer, filling the full trench region and the partial trench region, on an entire surface of the resultant structure where the second trench mask pattern is removed. The insulating layer is planarized until the first trench mask pattern is exposed. The first trench mask pattern is removed to expose the transistor active regions and the body contact active region.

The present invention further comprises forming source/drain regions of a second conductivity type opposite to the first conductivity type at both sides of the insulated gate pattern. The source/drain regions are formed to be in contact with the buried insulating layer. A well contact region can be formed at the body contact active region, the well contact region being doped with impurities of the first conductivity type.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIGS. 7B, 8B, 9B, 10B, 11B and 12B are cross-sectional views taken along the line IV–IV' of FIG. 4 for illustrating a method of fabricating SOI integrated circuit according to one embodiment of the present invention.

DETAILED DESCRIPTION OF PREFERRED EMBODIMENTS OF THE INVENTION

The present invention will be described in detail with reference to the accompanying drawings. Hereinafter, an SOI integrated circuit including N-MOSFETs or P-MOSFETs will be described with reference to the accompanying drawings. However, the present invention is applicable to SOI integrated circuits including CMOS circuits composed of P-MOSFETs and N-MOSFETs.

Figure 1:
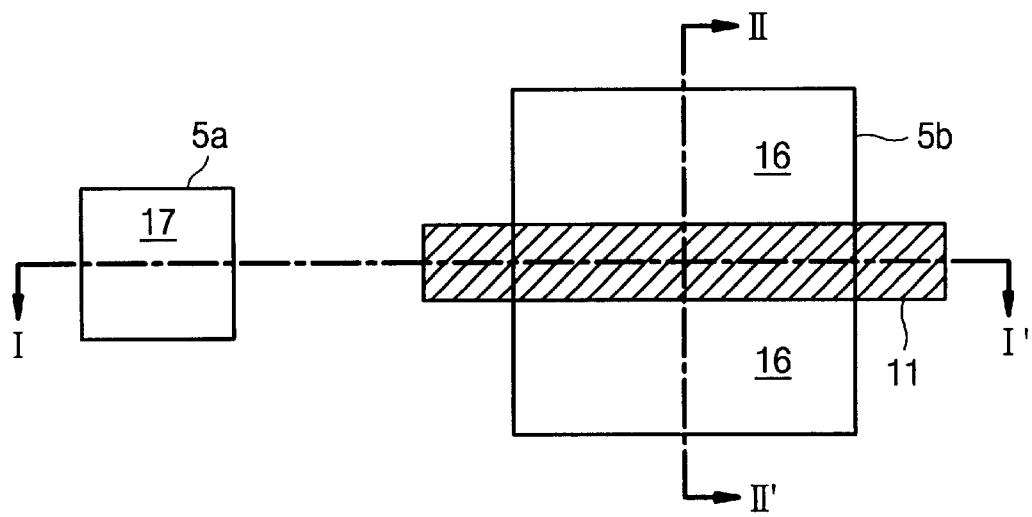
FIG. 1 is a schematic top plan view illustrating a conventional SOI MOSFET.
Figure 2:
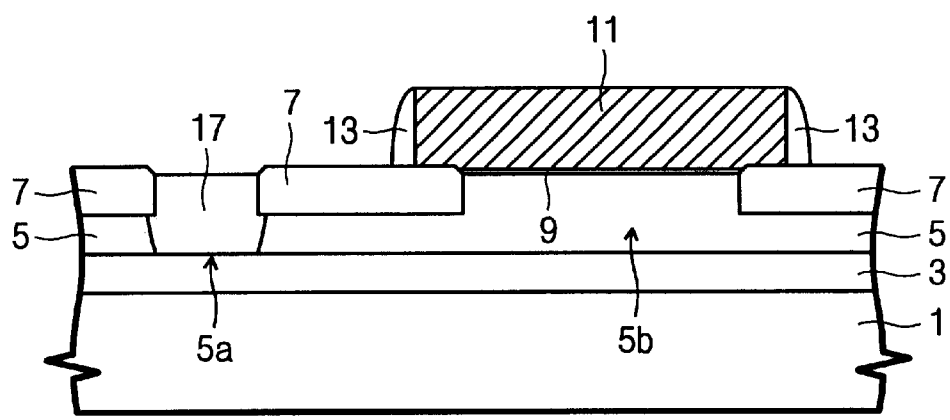
FIG. 2 is a cross-sectional view taken along the line I–I' of FIG. 1 for illustrating a conventional SOI MOSFET.
Figure 3:
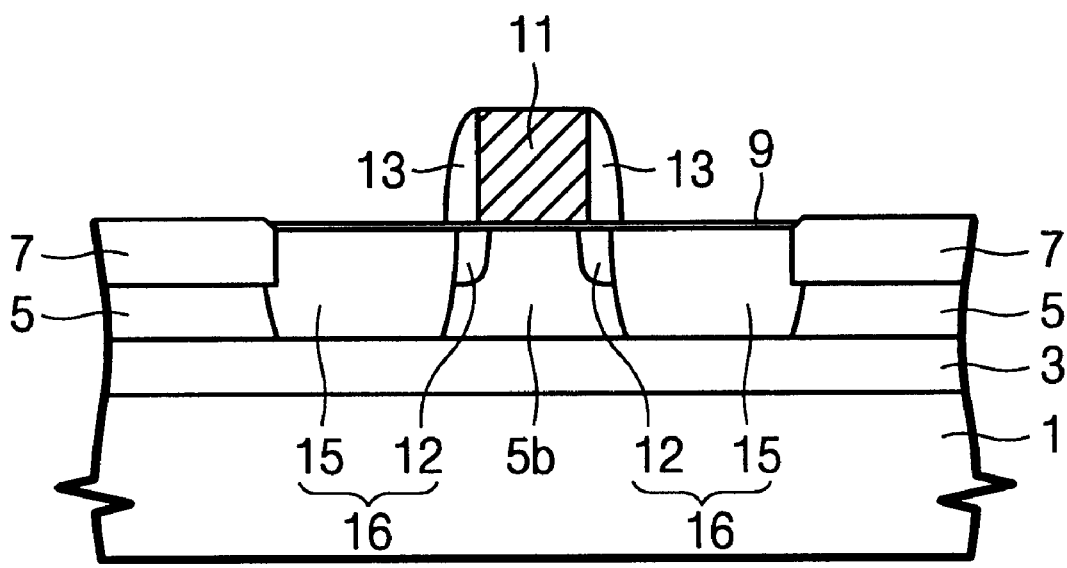
FIG. 3 is a cross-sectional view taken along the line II–II' of FIG. 1 for illustrating a conventional SOI MOSFET.
Figure 4:
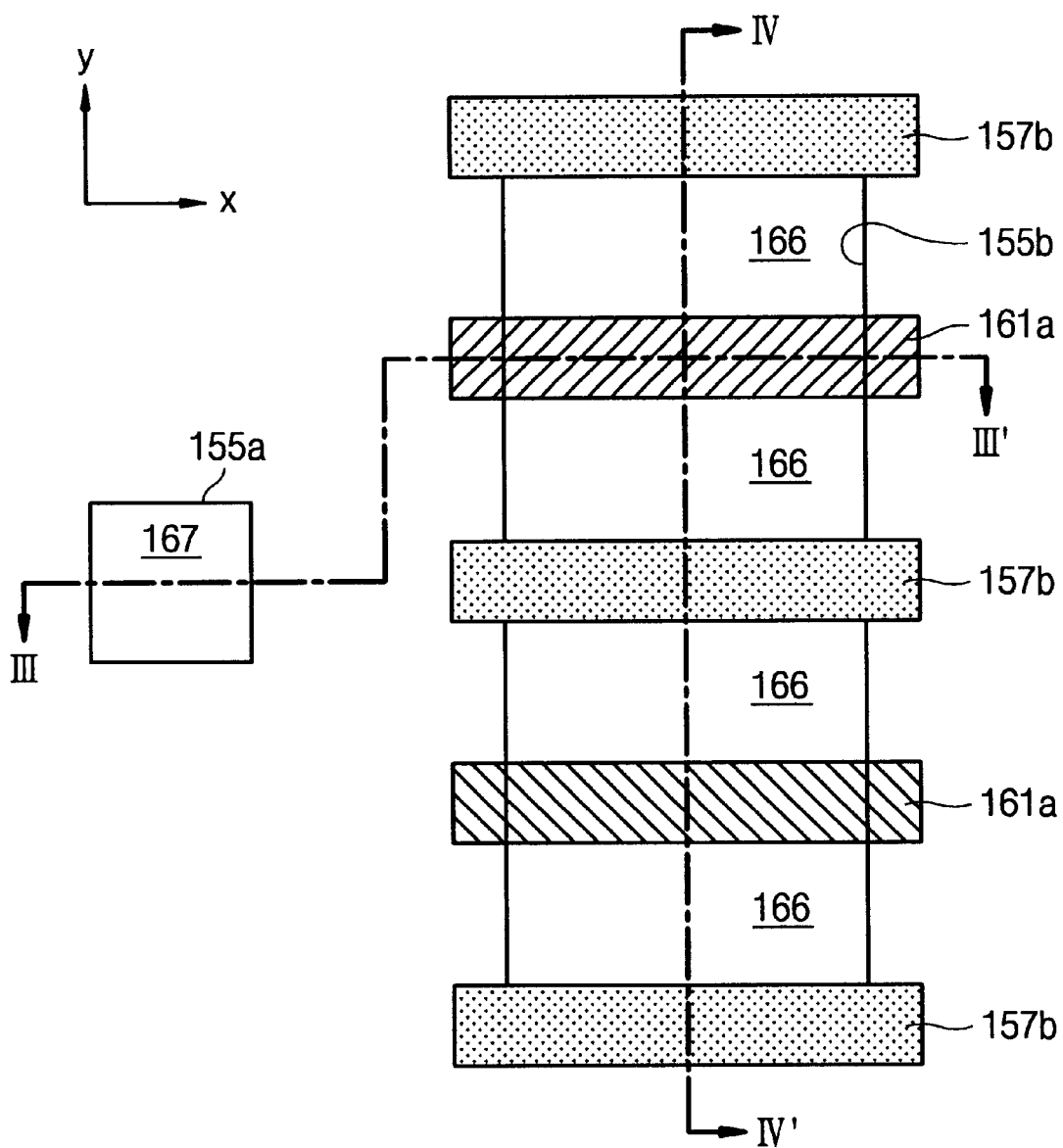
FIG. 4 is a top plan view of an SOI integrated circuit according to one embodiment of the present invention.

FIG. 4 is a top plan view showing an SOI integrated circuit according to one embodiment of the present invention. Also, FIG. 5 is a cross-sectional view taken along the line III–III' of FIG. 4 for illustrating an SOI integrated circuit according to the present invention, and FIG. 6 is a cross-sectional view taken along the line IV–IV' of FIG. 4 for illustrating an SOI integrated circuit according to the present invention.

Figure 5:
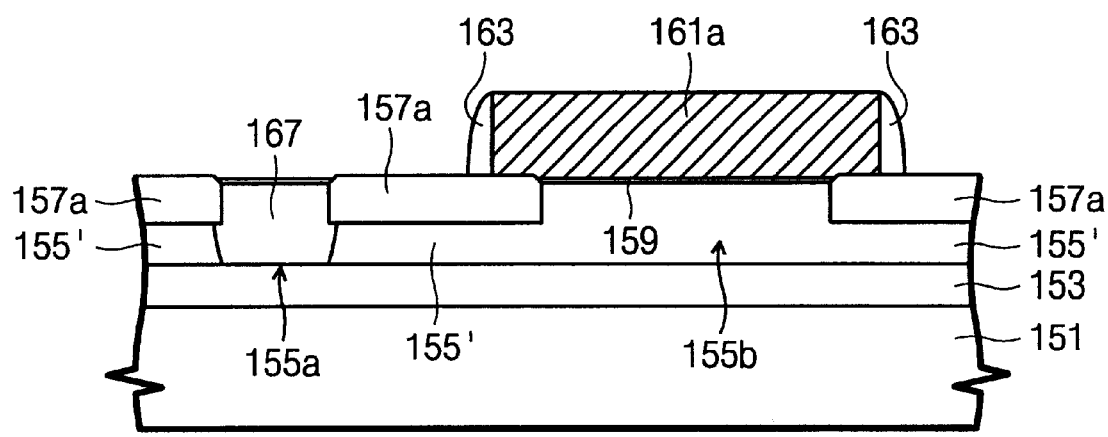
FIG. 5 is a cross-sectional view taken along the line III–III' of FIG. 4 for illustrating an SOI integrated circuit according to the present invention.
Figure 6:
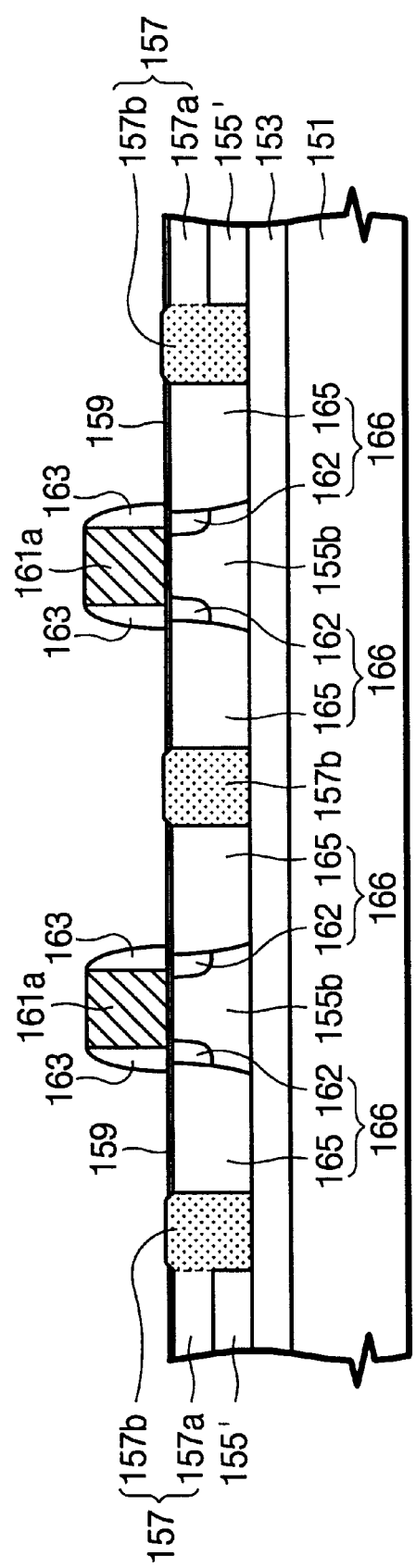
FIG. 6 is a cross-sectional view taken along the line IV–IV' of FIG. 4 for illustrating an SOI integrated circuit according to the present invention.

Referring to FIGS. 4, 5 and 6, a partial trench isolation layer 157a is formed at a predetermined region of a semiconductor layer having a first conductivity type. The first conductivity type is one of p-type and n-type. The semiconductor layer, e.g., a silicon layer, is stacked on a buried insulating layer 153 and the buried insulating layer 153 is disposed on a supporting substrate 151. The partial trench isolation layer 157a defines a plurality of transistor active regions 155b and at least one body contact active region 155a spaced apart from the transistor active regions 155b. A semiconductor residue layer 155' is interposed between the partial trench isolation layer 157a and the buried insulating layer 153 and is thinner than the body contact active region 155a and the transistor active regions 155b.

A bar-shaped full trench isolation layer 157b, which is parallel with x-axis, is interposed between the adjacent transistor active regions 155b. The full trench isolation layer 157b is in contact with sidewalls of the transistor active regions 155b adjacent thereto. Also, the full trench isolation layer 157b is in contact with the buried insulating layer 153 between the adjacent transistor active regions 155b. As a result, the adjacent transistor active regions 155b, which are disposed on a line that is parallel with y-axis, are separated by the full trench isolation layer 157b. The partial trench isolation layer 157a and the full trench isolation layer 157b constitute an isolation layer 157. Of all the sidewalls of the transistor active regions 155b, the sidewalls that are parallel to the y-axis are in contact with the semiconductor residue layer 155'. Accordingly, the transistor active regions 155b are electrically connected to the body contact active region 155a through the semiconductor residue layer 155'.

An insulated gate pattern 161 a is disposed to cross over the transistor active region 155b and is overlapped with the partial trench isolation layer 157a. The insulated gate pattern 161a is disposed to be parallel with the full trench isolation layer 157b. Also, the insulated gate pattern 161a is separated from the transistor active region 155b by a gate dielectric layer 159, which is interposed therebetween.

Source/drain regions 166 are formed at the transistor active region 155b, which is located at both sides of the insulated gate pattern 161a. The source/drain regions 166 have a second conductivity type opposite to the first conductivity type. Preferably, the source/drain regions 166 are in contact with the buried insulating layer 153. The source/drain regions 166 may have a lightly doped drain (LDD) structure including a lightly doped region 162 and a heavily doped region 165. These LDD shaped source/drain regions 166 may be realized using a spacer 163 formed on the sidewall of the insulated gate pattern 161a. As a result, the sidewalls of the source/drain regions 166, which are parallel with the gate pattern, are in contact with the full trench isolation layer 157b, and the bottoms of the source/drain regions 166 are in contact with the buried insulating layer 153. Accordingly, the source/drain junction capacitance is remarkably reduced, as compared with the conventional SOI technique. In addition, the latch-up immunity is enhanced because of the presence of the full trench isolation layer 157b between the adjacent transistor active regions 155b.

A well contact region 167 of the first conductivity type is formed at the body contact active region 155a. Thus, the well contact region 167 is electrically connected to the transistor active regions 155b (body regions) between the source/drain regions 166 through the semiconductor residue layer 155'.

FIGS. 7A to 12A and FIGS. 7B to 12B are cross-sectional views for illustrating fabrication methods of SOI integrated circuits according to the present invention. FIGS. 7A to 12A are cross-sectional views taken along the line III–III' of FIG. 4, and FIGS. 7B to 12B are cross sectional views taken along the line IV–IV' of FIG. 4.

Figure 7A:
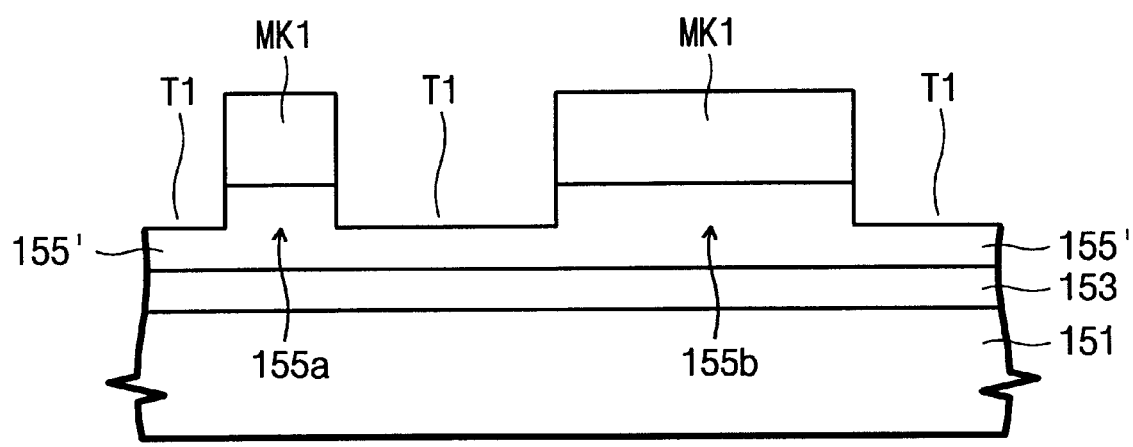
FIGS. 7A, 8A, 9A, 10A, 11A and 12A are cross-sectional views taken along the line III–III' of FIG. 4 for illustrating a method of fabricating SOI integrated circuit according to one embodiment of the present invention.
Figure 7B:
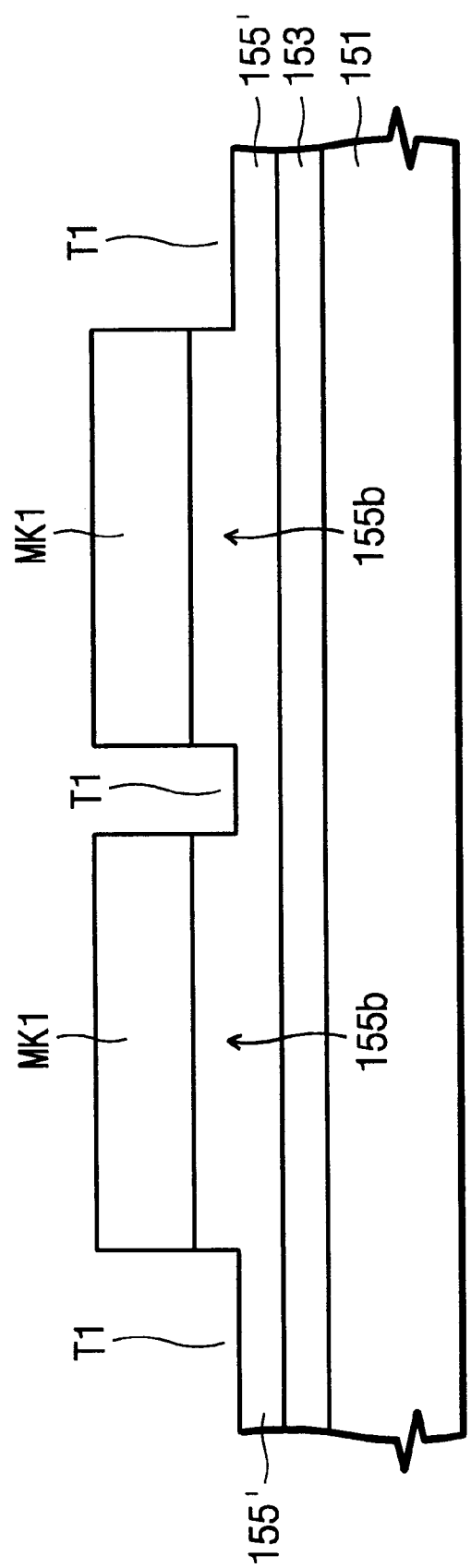

Referring to FIGS. 7A and 7B, a first trench mask pattern MK1 is formed on an SOI substrate including a supporting substrate 151, a buried insulating layer 153 on the supporting substrate 151 and a semiconductor layer of a first conductivity type, for example, p-type on the buried insulating layer 153. The semiconductor layer may be a silicon layer, and the first trench mask pattern MK1 is formed on the semiconductor layer. The semiconductor layer is etched using the first trench mask pattern MK1 as an etching mask, thereby forming a partial trench region T1 and concurrently defining at least one body contact active region 155a and a plurality of transistor active regions 155b spaced apart from the body contact active region 155a. The depth of the partial trench region T1 is less than the thickness of the semiconductor layer. Thus, a semiconductor residue layer 155', which is thinner than the semiconductor layer, exists under the partial trench region T1. Here, the first trench mask pattern MK1 is formed by depositing a first trench mask layer on the semiconductor layer and patterning the first trench mask layer. The first trench mask layer comprises a pad oxide layer and a pad nitride layer, which are sequentially stacked.

Figure 8A:
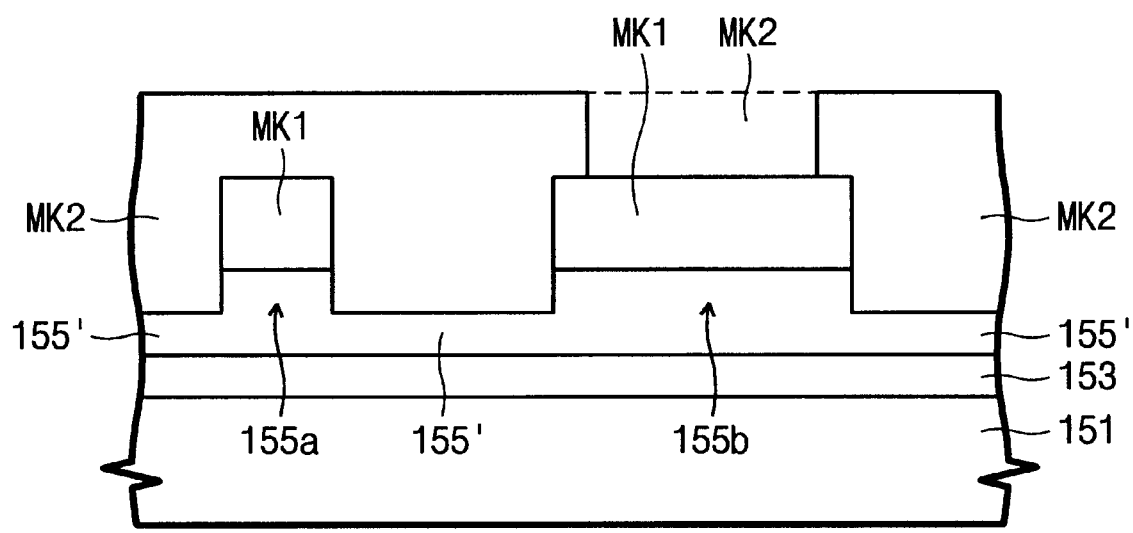
Figure 8B:
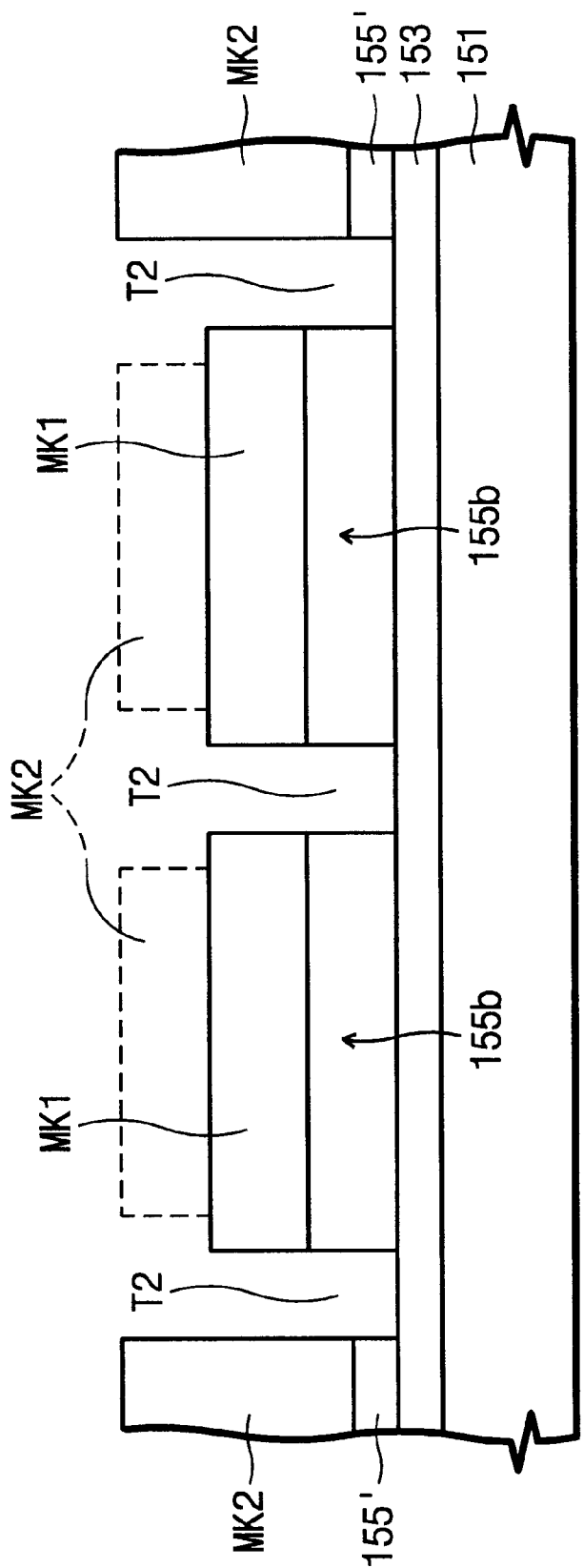

Referring to FIGS. 8A and 8B, a second trench mask layer is formed on an entire surface of the substrate including the partial trench region T1 and the first trench mask pattern MK1. The second trench mask layer is preferably formed of a photoresist layer. The second trench mask layer is patterned using a conventional photolithography process to form a second trench mask pattern MK2 exposing the semiconductor residue layer 155' between the transistor active regions 155b. Also, the first trench mask pattern MK1, which is disposed on the transistor active region 155b, may be exposed by the second trench mask pattern MK2. Using the first and second trench mask patterns MK1 and MK2 as etching masks, the exposed semiconductor residue layer 155' is etched until the buried insulating layer 153 is exposed. As a result, a bar-shaped full trench region T2 is formed between the transistor active regions 155b. Also, the full trench region T2 exposes the sidewalls of the transistor active regions 155b, which are parallel with the x-axis of FIG. 4.

Figure 9A:
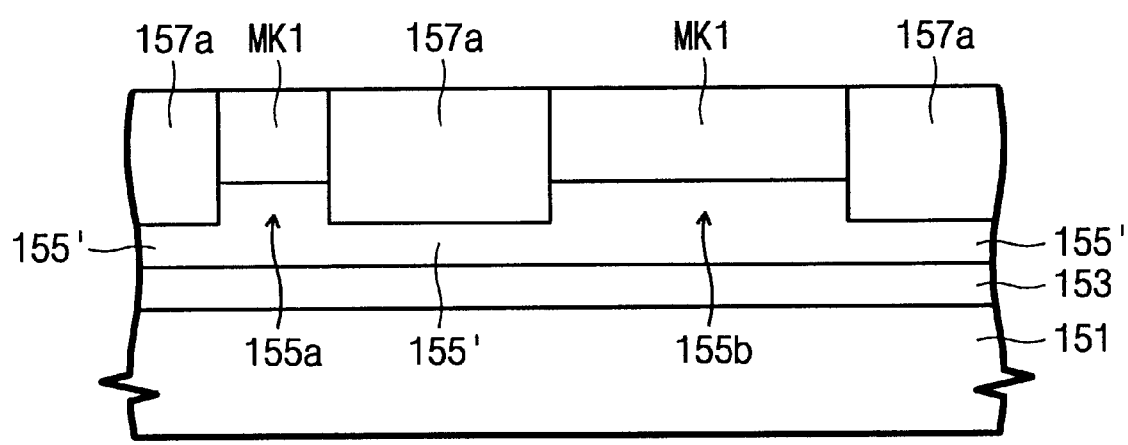

Referring to FIGS. 9A and 9B, the second trench mask pattern MK2 is selectively removed. An insulating layer is then formed on an entire surface of the resultant structure where the second trench mask pattern MK2 is removed. The insulating layer is planarized until the first trench mask pattern MK1 is exposed, thereby forming an isolation layer 157 in the partial trench region T1 and the full trench region T2. The planarization of the insulating layer may be performed using a chemical mechanical polishing (CMP) process or an etch-back process. The isolation layer 157 comprises a partial trench isolation layer 157a filling the partial trench region T1 and a full trench isolation layer 157b filling the full trench region T2. As a result, the full trench isolation layer 157b has the bar shape which is parallel with the x-axis.

Figure 10A:
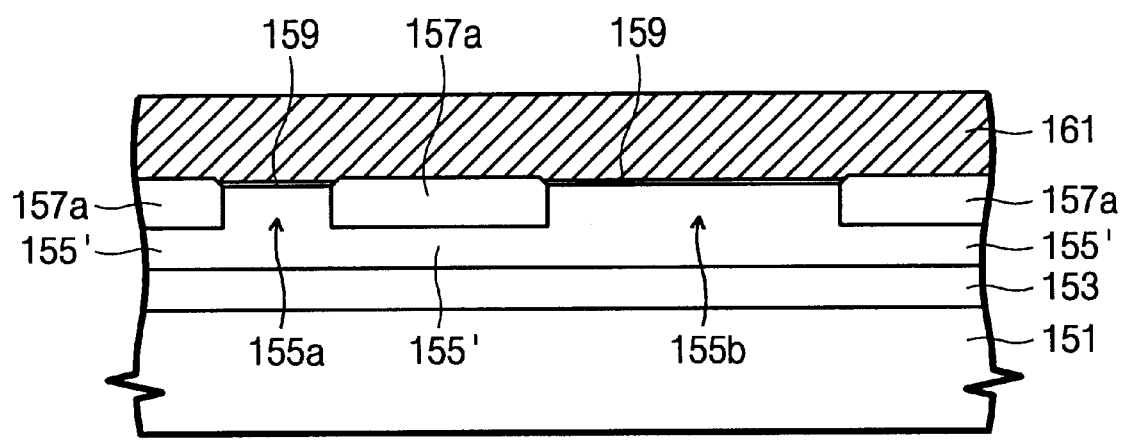
Figure 10B:
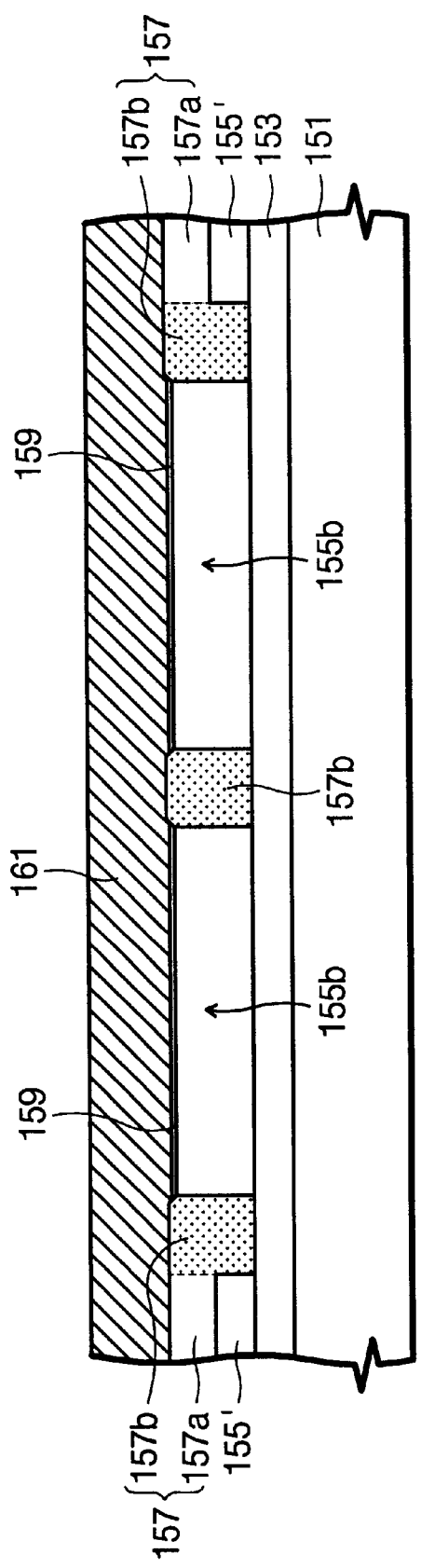

Referring to FIGS. 10A and 10B, the first trench mask pattern MK1 is removed to expose the body contact active region 155a and the transistor active regions 155b. A gate dielectric layer 159 is formed on the exposed body contact active region 155a and the exposed transistor active regions 155b. A conductive layer 161 is formed on an entire surface of the resultant structure having the gate dielectric layer 159.

Figure 11A:
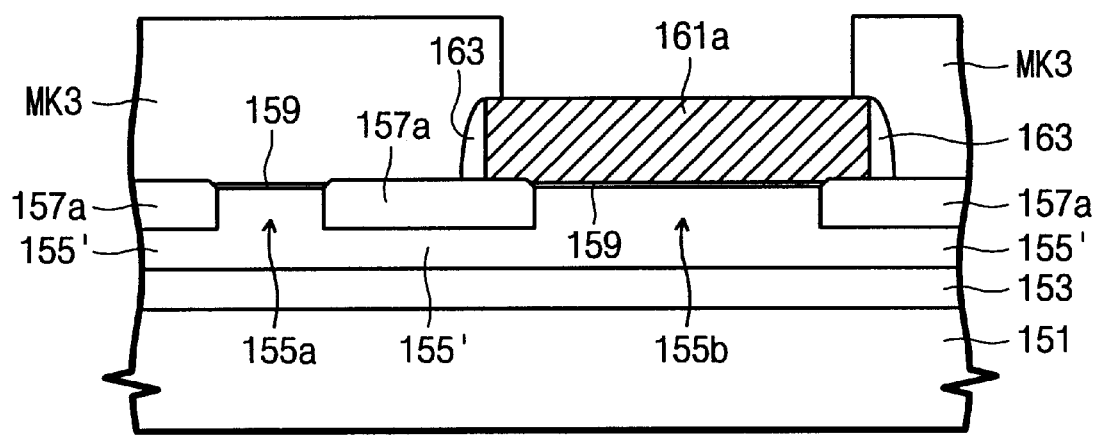
Figure 11B:
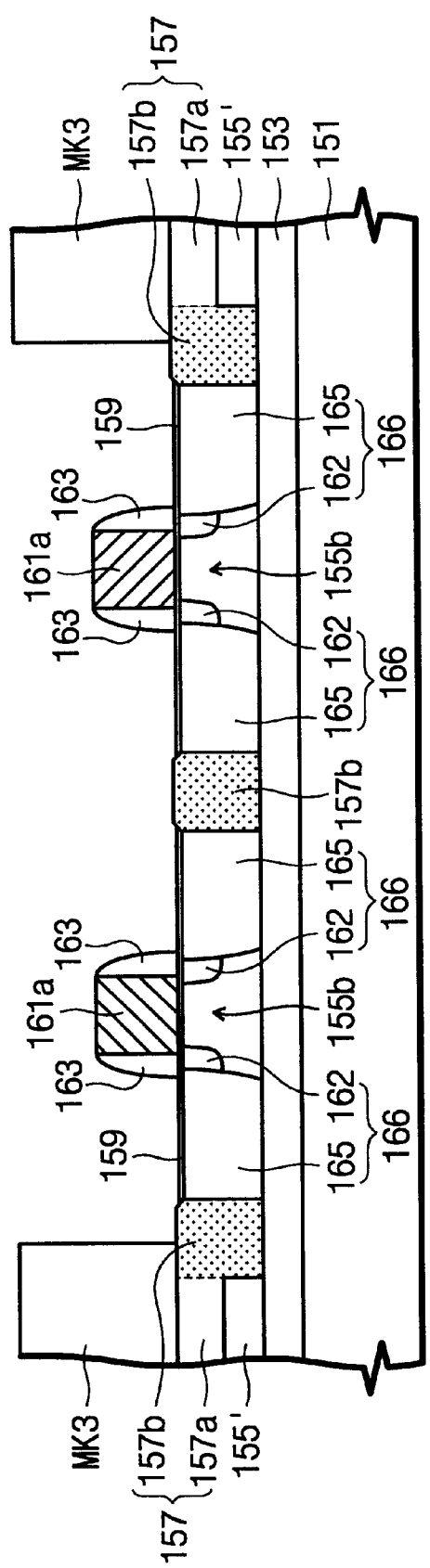

Referring to FIGS. 11A and 11B, the conductive layer 161 is patterned to form an insulated gate pattern 161a crossing over each of the transistor active regions 155b. The gate pattern 161a is formed to be parallel with the full trench isolation layer 157b. Impurities of a second conductivity type, i.e., n-type impurities are then implanted into the transistor active region 155b at a low dose of $1\times10^{12}$ ion atoms/cm$^2$ to $1\times10^{14}$ ion atoms/cm$^2$ using the insulated gate pattern 161a as an implantation mask. As a result, lightly doped regions 162 of the second conductivity type are formed at both sides of the gate pattern 161a. Subsequently, a spacer 163 is formed on the sidewall of the gate pattern 161a.

A source/drain implantation mask MK3 is formed on the substrate having the spacer 163. The source/drain implantation mask MK3 has openings that expose the transistor active regions 155b. Impurities of the second conductivity type are implanted into the lightly doped regions 162 at a high dose of $1\times10^{14}$ ion atoms/cm$^2$ to $5\times10^{15}$ ion atoms/cm$^2$ using the insulated gate pattern 161a, the spacer 163 and the source/drain implantation mask MK3 as implantation masks. As a result, heavily doped regions 165 of the second conductivity type are formed at both sides of the gate pattern 161a. The lightly doped region 162 and the heavily doped region 165 constitute a lightly doped drain (LDD) shaped source/drain region 166. The bottom of the source/drain regions 166 are in contact with the buried insulating layer 153. Also, the sidewalls of the source/drain regions 166, which are parallel with the gate pattern 161a, are in contact with the full trench isolation layer 157b. Thus, source/drain junction capacitance is remarkably reduced.

Figure 12A:
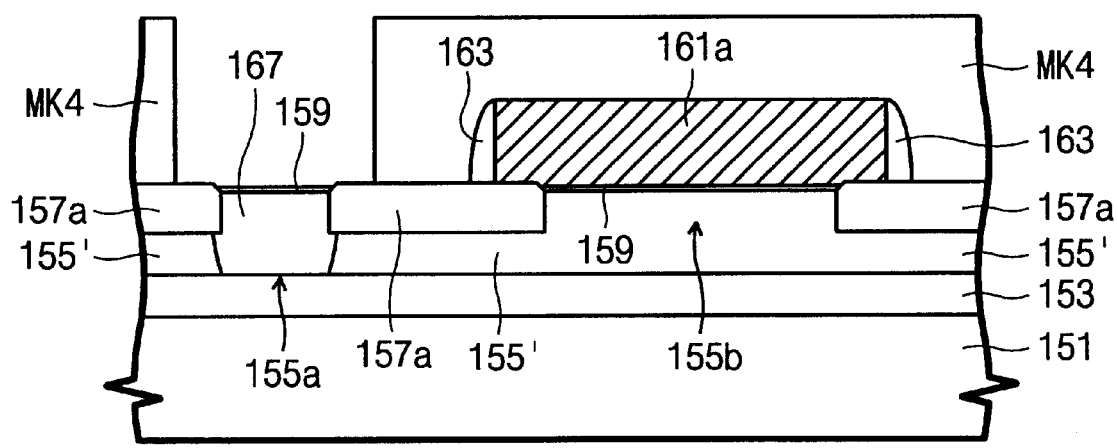

Referring to FIGS. 12A and 12B, the source/drain implantation mask MK3 is removed. A well contact implantation mask MK4 is formed on the resultant structure where the source/drain implantation mask MK3 is removed. The well contact implantation mask MK4 exposes the body contact active region 155a. Impurities of the first conductivity type are implanted into the body contact active region 155a using the well contact implantation mask MK4 as an implantation mask. As a result, a well contact region 167 of the first conductivity type is formed in the body contact active region 155a. Accordingly, the well contact region 167 is electrically connected to the transistor active regions (i.e. body regions) between the source/drain regions 166 through the semiconductor residue layer 155'.

As described above, the present invention can remarkably reduce the junction capacitance and enhance the latch-up immunity because of the presence of the full trench isolation layer that is in contact with the sidewalls of the source/drain regions.

While this invention has been particularly shown and described with references to preferred embodiments thereof, it will be understood by those skilled in the art that various changes in form and details may be made therein without departing from the spirit and scope of the invention as defined by the following claims.

What is claimed is:

1. A silicon-on-insulator (SOI) semiconductor integrated circuit formed on an SOI substrate including a supporting substrate, a buried insulating layer on the supporting substrate and a semiconductor layer of a first conductivity type on the buried insulating layer, the integrated circuit comprising:

a plurality of transistor active regions in a predetermined region of the semiconductor layer, the plurality of transistor active regions being of the same transistor conductivity type;

at least one body contact active region spaced apart from the transistor active regions, the body contact active region including a portion of the semiconductor layer;

a semiconductor residue layer disposed over the entire surface of the buried insulating layer between the transistor active regions and the body contact active region, the semiconductor residue layer being thinner than the semiconductor layer;

a partial trench isolation layer disposed on the semiconductor residue layer;

an insulated gate pattern crossing over the respective transistor active regions; and a bar-shaped full trench isolation layer interposed between the adjacent transistor active regions and running parallel with the gate pattern, the full trench isolation layer being in contact with the buried insulating layer between the adjacent active regions and being in contact with the entire sidewalls of the transistor active regions that are parallel with the gate pattern.

2. The silicon-on-insulator (SOI) semiconductor integrated circuit of claim 1, wherein the first conductivity type is one of P-type and N-type.

3. The silicon-on-insulator (SOI) semiconductor integrated circuit of claim 1, wherein the semiconductor layer is a silicon layer.

4. The silicon-on-insulator (SOI) semiconductor integrated circuit of claim 1, further comprising source/drain regions formed at the transistor active regions, the source/drain regions being located at both sides of the insulated gate pattern, the source/drain regions having a second conductivity type opposite to the first conductivity type and being in contact with the buried insulating layer.

5. The silicon-on-insulator (SOI) semiconductor integrated circuit of claim 1, further comprising a well contact region formed at the body contact active region, the well contact region having the first conductivity type.

* * * * *